(12) United States Patent
Oshida et al.

(10) Patent No.: US 11,810,759 B2
(45) Date of Patent: Nov. 7, 2023

(54) RF GENERATOR

(71) Applicant: HITACHI KOKUSAI ELECTRIC INC., Tokyo (JP)

(72) Inventors: Yoshiyuki Oshida, Tokyo (JP); Naoya Fujimoto, Tokyo (JP); Norikazu Kato, Tokyo (JP); Sunao Egashira, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 275 days.

(21) Appl. No.: 17/428,888

(22) PCT Filed: Feb. 14, 2019

(86) PCT No.: PCT/JP2019/005368
§ 371 (c)(1),
(2) Date: Aug. 5, 2021

(87) PCT Pub. No.: WO2020/166009
PCT Pub. Date: Aug. 20, 2020

(65) Prior Publication Data
US 2022/0122806 A1  Apr. 21, 2022

(51) Int. Cl.
*H01J 37/32*  (2006.01)
(52) U.S. Cl.
CPC ..... *H01J 37/3211* (2013.01); *H01J 37/32183* (2013.01)
(58) Field of Classification Search
CPC ............. H01J 37/3211; H01J 37/32165; H01J 37/32183; H05H 1/46
See application file for complete search history.

(56) References Cited

U.S. PATENT DOCUMENTS

2010/0194195 A1*  8/2010  Coumou ........... H01J 37/32174
307/24
2013/0302992 A1*  11/2013  Nozawa ............... H01J 37/3244
438/758

(Continued)

FOREIGN PATENT DOCUMENTS

JP  2010-219026 A  9/2010
JP  2013-125729 A  6/2013

(Continued)

OTHER PUBLICATIONS

International Search Report dated Apr. 9, 2019.

*Primary Examiner* — Raymond R Chai
(74) *Attorney, Agent, or Firm* — BACON&THOMAS, PLLC

(57) ABSTRACT

The RF generator is provided with a first RF power source and a second RF power source that generate RF waves of different frequencies from each other, and respectively supply RF power to a first antenna and a second antenna that are installed in a plasma reactor. The first RF power source is provided with a first computing circuit that detects a first forward wave level and a first reflected wave level by removing an oscillation frequency component and an interference wave component of the second RF power source, a second computing circuit that detects a second forward wave level and a second reflected wave level that include an oscillation frequency of the first RF power source and the oscillation frequency component and the interference wave component of the second RF power source, and an interference wave computing circuit that, on the basis of the second forward wave level and the second reflected wave level, and the first forward wave level and the first reflected wave level, calculates an interference wave level to be detected by the first RF power source.

11 Claims, 9 Drawing Sheets

(56) References Cited

U.S. PATENT DOCUMENTS

| | | | | |
|---|---|---|---|---|
| 2014/0263199 A1* | 9/2014 | Nelson | ............. | H01J 37/32082 |
| | | | | 219/121.4 |
| 2014/0345802 A1* | 11/2014 | Umehara | ............ | H01J 37/3244 |
| | | | | 156/345.28 |
| 2017/0062186 A1* | 3/2017 | Coumou | ........... | H01J 37/32972 |
| 2017/0084462 A1* | 3/2017 | Vukovic | ................... | H01P 1/38 |
| 2017/0372873 A1* | 12/2017 | Yamada | ............ | H01J 37/32183 |
| 2019/0108976 A1* | 4/2019 | Van Zyl | ............ | H01J 37/32174 |

FOREIGN PATENT DOCUMENTS

| | | | |
|---|---|---|---|
| JP | 2013-125892 A | 6/2013 | |
| JP | 2013-197080 A | 9/2013 | |
| JP | 2014-501027 A | 1/2014 | |
| JP | 2016-521430 A | 7/2016 | |
| JP | 2018-534716 A | 11/2018 | |

* cited by examiner

RF GENERATOR

TECHNICAL FIELD

The present disclosure relates to a RF Generator and is applicable to, for example, a RF Generator used in a plasma processing apparatus.

BACKGROUND

Plasma processing apparatuses or laser processing apparatuses are used as industrial apparatuses for receiving radio frequency (RF) power from a RF Generator to generate plasma or laser and using the generated plasma or laser to perform surface treatment or processing. For example, a plasma processing apparatus includes (one or more) antennas which supply RF energy to a plasma reactor, (one or more) RF Generator s which supply RF energy, and (one or more) matching devices which perform matching on a transmission line between each of the antennas and the RF Generator. The RF Generator includes an automatic control mechanism which detects a forward wave and a reflected wave, calculates a reflection coefficient from levels and phases of the detected forward wave and reflected wave, and controls the level of the reflected wave so as to be decreased.

Since RF power output through one antenna from one RF power source reaches the other RF power source via a plasma reactor and the other antenna, a forward wave and a reflected wave observed by the other RF power source include an interference wave from the one RF power source and an intermodulation wave generated from a forward wave of the other RF power source and the interference wave from the one RF power source.

PRIOR ART DOCUMENTS

Patent Documents

Patent Document 1: Japanese Patent Application Publication No. 2013-197080
Patent Document 2: Japanese Patent Application Publication No. 2013-125892

SUMMARY

Problems to be Resolved by the Invention

As described above, when a plurality of RF power sources are provided, due to an interference wave or an intermodulation wave caused by RF power from other RF power source(s), a level of a forward wave or a reflected wave may not be accurately detected, and a stable matching operation may not be possible, thereby resulting in a decrease in power efficiency.

The present disclosure is directed to providing a RF Generator capable of reducing the influences of an interference wave and the like.

Means of Solving the Problems

A brief outline of the representative ones of the present disclosure is as follows.

A RF Generator comprises a first RF power source and a second RF power source which generate RF waves having different frequencies and respectively supply RF powers to a first antenna and a second antenna installed in a plasma reactor. The first RF power source includes a first calculation circuit configured to remove an oscillation frequency component and an interference wave component of the second RF power source and configured to detect a first forward wave level and a first reflected wave level, a second calculation circuit configured to detect a second forward wave level and a second reflected wave level including an oscillation frequency of the first RF power source and the oscillation frequency component and the interference wave component of the second RF power source, and an interference wave calculation circuit configured to calculate an interference wave level detected by the first RF power source based on the second forward wave level, the second reflected wave level, the first forward wave level, and the first reflected wave level.

Effect of the Invention

According to the RF Generator, it is possible to reduce the influence of interference waves and the like.

DETAILED DESCRIPTION

Figure 1:
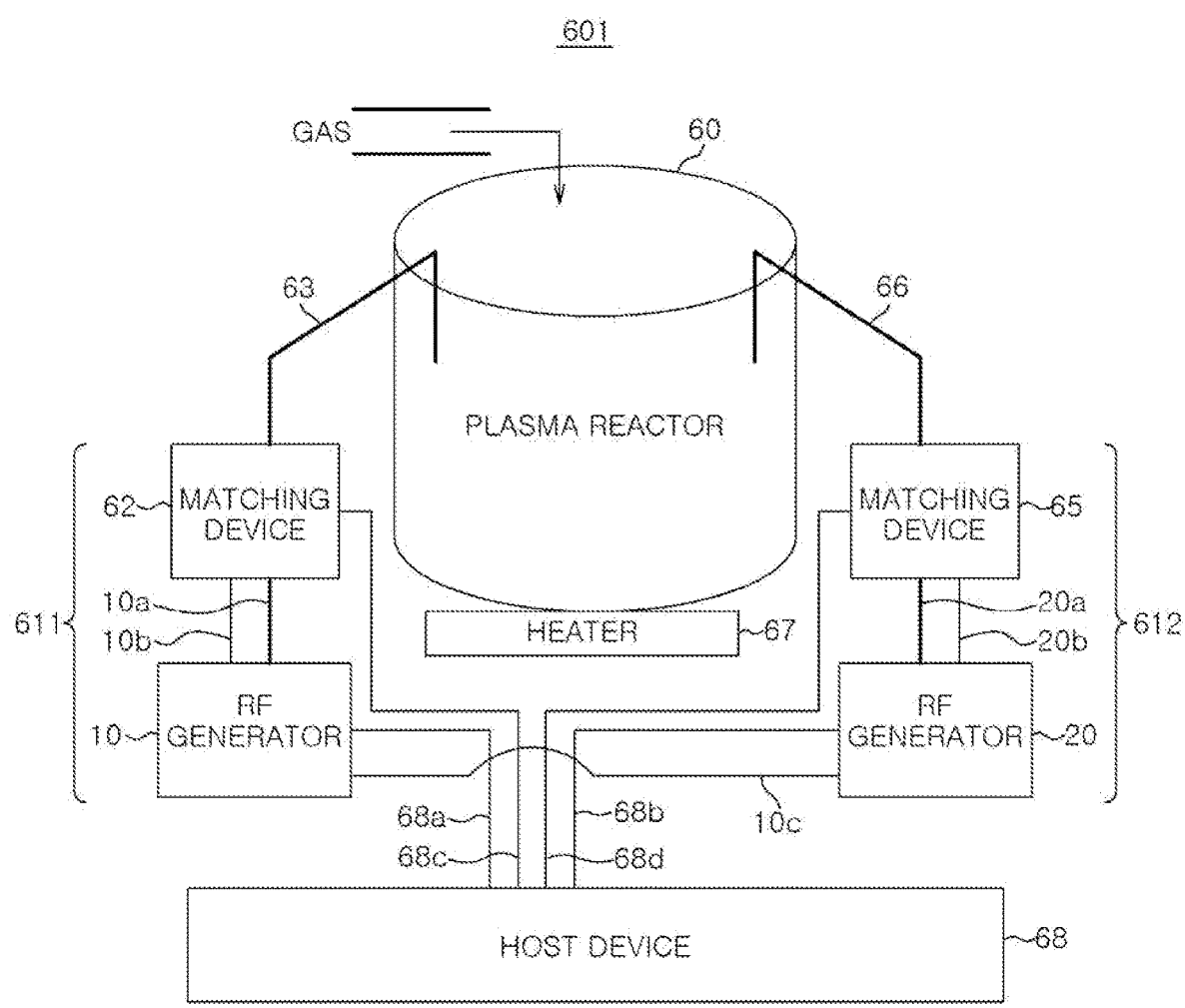
FIG. 1 is a schematic block diagram of a plasma processing apparatus according to a first embodiment.

Hereinafter, embodiments will be described with reference to the accompanying drawings. However, in the following description, there may be a case in which the same components are designated by the same reference numerals and the repeated descriptions thereof are omitted.

First, the influences of the above-described interference wave and intermodulation wave will be described.

In a case in which an interference wave or an intermodulation wave is observed in a forward wave detection circuit, when a level of the interference wave or the intermodulation wave is low and thus a detection level of the forward wave is not affected, there is no problem. When a level of the interference wave or the intermodulation wave cannot be ignored, however, a detection level of the forward wave is slightly higher than an actual level. Therefore, a RF power source performs control to reduce an output of the RF power source so as for the detection level of the forward wave to converge to a set value.

As a result, power applied to a plasma reactor is decreased, and, thus, stability of plasma ignition is decreased. Further, even if plasma is ignited, a plasma density in the plasma reactor is decreased, which will cause influences, such as a decrease in the rate of plasma processing.

In addition, in a case in which an interference wave or an intermodulation wave is observed in a reflected wave detection circuit, when a level of the interference wave or the intermodulation wave cannot be ignored, a detection level of the reflected wave is slightly higher than an actual level. Therefore, a RF power source performs automatic matching control such as changing a capacitance value so as for the detection level of the reflected wave to converge to zero. However, since an interference wave from the RF power source is continuously detected as the reflected wave, the automatic matching is not completed, and an operation, in which the matching operation is continuously retried, may be caused.

As a result, a plasma density in a plasma reactor may fluctuate, or a rate of plasma processing may fluctuate, which may have an influence of causing an unstable operation.

First Embodiment

Therefore, in a RF Generator and a plasma processing apparatus according to a first embodiment, an interference wave or an intermodulation wave is removed, and a more stable matching operation is performed, thereby further improving power efficiency.

Plasma Processing Apparatus

A configuration of the plasma processing apparatus according to the first embodiment will be described with reference to FIG. 1. FIG. 1 is a schematic block diagram of the plasma processing apparatus according to the first embodiment.

As shown in FIG. 1, a plasma processing apparatus 601 according to the first embodiment includes a plasma reactor 60, a heater 67, antennas 63 and 66, RF power sources 10 and 20, matching devices 62 and 65, and a host device 68 which performs control related to the plasma processing apparatus.

The RF power sources 10 and 20 and the matching devices 62 and 65 are connected to the host device 68 through control lines 68a, 68b, 68c, and 68d. In addition, although not shown, the heater 67 is also connected to the host device 68 through the control line.

In some cases, the matching devices 62 and 65, instead of being connected to the host device 68, may be connected to the RF power sources 10 and 20 through control lines 10b and 20b, and controlled by the RF power sources 10 and 20.

The plasma reactor 60 applies a RF voltage to a supplied gas and uses generated plasma to process a substrate such as a wafer or a glass substrate. The RF power sources 10 and 20 are RF power sources which amplify a RF wave generated in an oscillation circuit and output RF power. The antennas 63 and 66 supply RF power to the plasma reactor 60 which is a load device.

The matching device 62 is an impedance matching circuit which matches an output impedance of the RF power source 10 with input impedances of loads (the antenna 63 and the plasma reactor 60). Similarly, the matching device 65 is an impedance matching circuit which matches an output impedance of the RF power source 20 with input impedances of loads (the antenna 66 and the plasma reactor 60). When the impedance matching circuit is not provided, a reflected wave is generated from a load device such as the plasma reactor 60, and only a portion of output power is supplied to the load device, thereby resulting in a decrease in power efficiency. In order to suppress the reflected wave, the impedance matching circuit is required between the RF power source and the load device. The matching devices 62 and 65 each includes a matching circuit including a variable capacitor and a coil which will be described below. The matching devices 62 and 65 perform impedance matching by adjusting a capacitance of the variable capacitor.

A supply of power to the plasma reactor 60 will be described. Here, a supply of power from the RF power source 10 which is a first system 611 will be described, and same applies to a second system 612.

RF power output from the RF power source 10 is input to the matching device 62 through a RF coaxial cable 10a and is impedance-adjusted by the matching circuit in the matching device 62 and output to the plasma reactor 60 through the antenna 63.

A temperature of the plasma reactor 60 is managed by the heater 67 controlled by the host device 68, and a gas flow rate and pressure thereof are also controlled. A distribution of plasma generated in the plasma reactor 60 may be controlled by the number, shape, or arrangement of antennas, and in order to suppress damage to a substrate and ensure the uniformity of the distribution of plasma, arranging a plurality of antennas is an effective method. In addition, here, although only one antenna is provided for one matching device, a configuration is also possible in which RF power is distributed from one matching device to a plurality of antennas and output to the plasma reactor.

The RF power sources 10 and 20 operate under control of the host device 68. The host device 68 instructs the RF power sources 10 and 20 to turn an output on or off or performs presetting (initial value setting) such as setting RF output power or setting an output frequency. In addition, the host device 68 performs presetting (initial value setting) such as setting capacitance values of the variable capacitors of the matching devices 62 and 65 to be described below.

A RF Generator 610 has an automatic matching function of suppressing a reflected wave under control of the host device 68 in order to prevent a decrease in power efficiency. The automatic matching function will be briefly described.

In the first system 611, when an instruction to turn an output on is input from the host device 68, the RF power source 10 starts to output RF power and detects a forward wave and a reflected wave of the RF output power. The RF power source 10 calculates a reflection coefficient from levels and phases of the detected forward wave and reflected wave and controls a capacitance value of the variable capacitor of the matching device 62 and an output frequency of the RF power source 10 such that the level of the reflected wave is decreased.

Also in the second system 612, the RF power source 20 calculates a reflection coefficient from levels and phases of the detected forward wave and reflected wave and controls a capacitance value of the variable capacitor of the matching device 65 and an output frequency of the RF power source 20 such that the level of the reflected wave is decreased.

In this way, the automatic matching function in the RF Generator is realized.

In the RF Generator 610, in order to avoid the influences of an interference wave and an intermodulation wave, two RF power sources 10 and 20 determine an oscillation frequency in the oscillation circuit in conjunction with each other. Therefore, in FIG. 1, the two RF power sources 10 and 20 are connected to each other through a control line 10c.

Configuration of RF Generator

Figure 2:
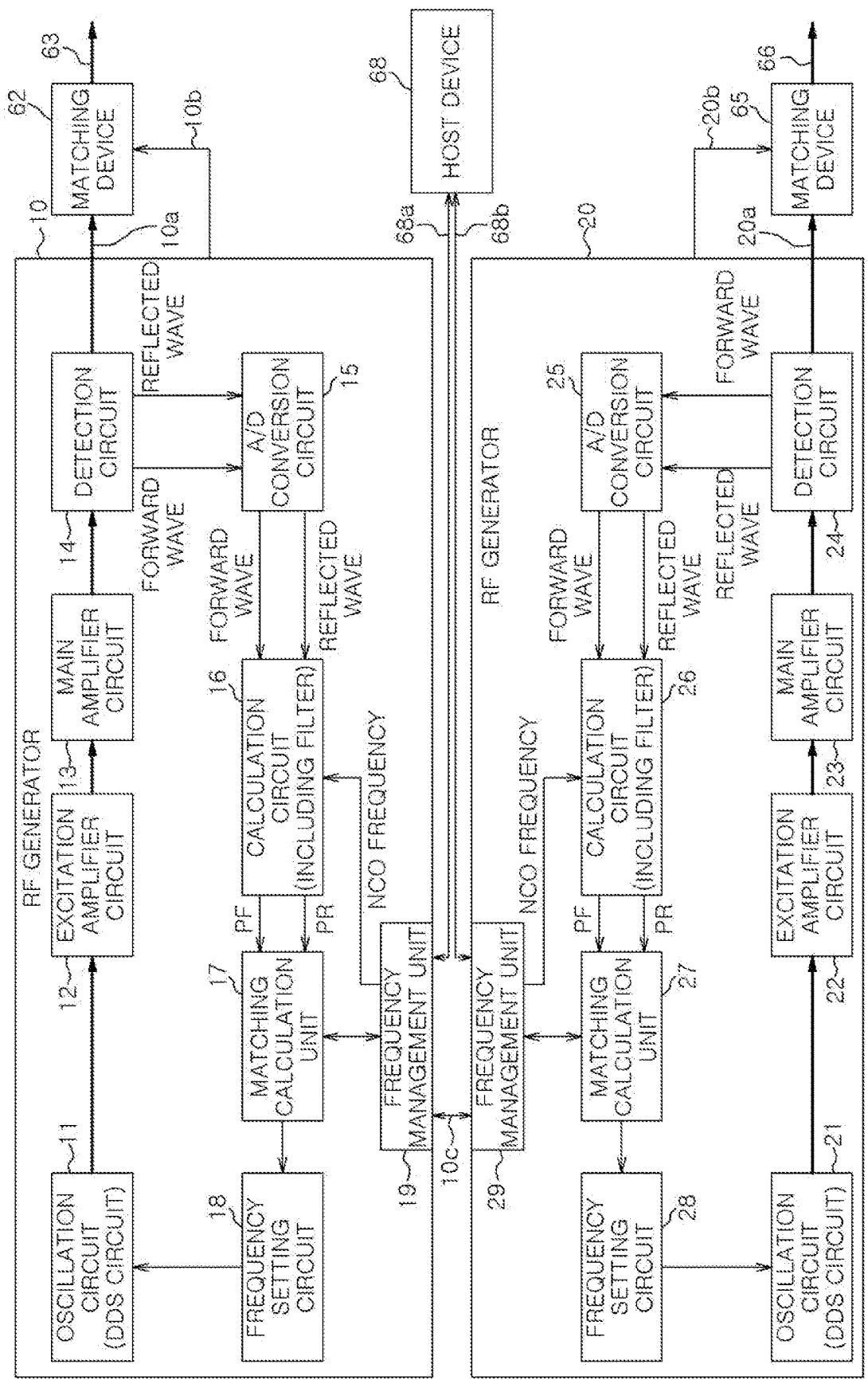
FIG. 2 is a block diagram illustrating a configuration of a RF Generator of FIG. 1.
Figure 3:
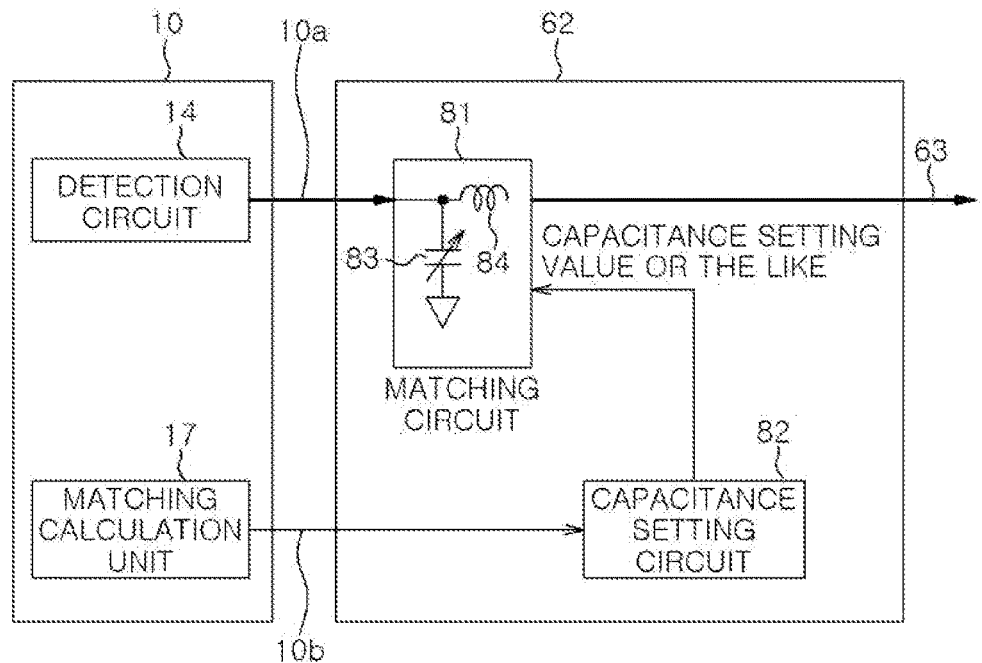
FIG. 3 is a block diagram illustrating a configuration of a matching device of FIG. 1.

A configuration of the RF Generator will be described with reference to FIGS. 2 and 3. FIG. 2 is a block diagram illustrating the configuration of the RF Generator. FIG. 3 is a block diagram illustrating a configuration of the matching device of the RF Generator of FIG. 2.

Here, the RF power source 10 and the matching device 62 of the first system 611 will be described, and the RF power source 20 and the matching device 65 of the second system 612 have the same configurations and operations. As shown in FIG. 2, although the RF power source 10 and the RF power source 20 have the same basic configuration, for the sake of convenience, it is assumed that the RF power source 10 is used as a master device, the RF power source 20 is used as a slave device, and a frequency interlocking process of controlling output frequencies of RF powers thereof in conjunction with each other is performed by the RF power source 10 which is the master device.

RF Power Source

As shown in FIG. 2, the RF power source 10 includes an oscillation circuit 11, an excitation amplifier circuit 12, a main amplifier circuit 13, a detection circuit 14, an A/D conversion circuit 15, a calculation circuit 16, a matching calculation unit 17, and a frequency setting circuit 18. In addition, as shown in FIG. 3, the matching device 62 includes a matching circuit 81 and a capacitance setting circuit 82. Each unit of the RF power source 10 will be described below.

The oscillation circuit 11 includes a direct digital synthesizer (DDS) and the like, and generates a RF signal having a set frequency.

The excitation amplifier circuit 12 and the main amplifier circuit 13 amplify the RF signal from the oscillation circuit 11 to a predetermined output level. In the example of FIG. 2, although one excitation amplifier circuit 12 and one main amplifier circuit 13 are provided, a plurality of excitation amplifier circuits 12 and a plurality of main amplifier circuits 13 may be provided, and a distributor or a combiner may be used therebetween.

The detection circuit 14 includes a directional coupler and the like, detects a forward wave and a reflected wave, and outputs each monitor signal.

The A/D conversion circuit 15 converts a monitor signal, which is an analog signal, into a digital signal.

The calculation circuit 16 calculates a level of a forward wave and a level of a reflected wave from an input signal and obtains a reflection coefficient from the level of the forward wave, the level of the reflected wave, and phases thereof.

Based on the reflection coefficient, the matching calculation unit 17 determines a capacitance value of a variable capacitor 83 of the matching circuit 81 such that the level of the reflected wave is decreased and determines a frequency value of the oscillation circuit 11 such that the level of the reflected wave is decreased.

The frequency setting circuit 18 sets the frequency value input from the matching calculation unit 17 as an oscillation frequency of the oscillation circuit 11.

As shown in FIG. 3, the matching circuit 81 of the matching device 62 includes the variable capacitor 83 and a coil 84 and adjusts an impedance of an input RF signal to output the input RF signal to the antenna 63. When the determined capacitance value from the matching calculation unit 17 of the RF power source 10 is input, the capacitance setting circuit 82 sets a capacitance value of the variable capacitor 83 of the matching circuit 81.

Although FIG. 2 shows a configuration in which a feedback system from the detection circuit 14 to the matching calculation unit 17 is provided only in the RF power source 10, and thus, the matching calculation unit 17 calculates both an oscillation frequency and a capacitance value of the variable capacitor 83, a configuration is also possible in which the same circuit configuration is provided only in the matching device 62 or provided in both the RF power source 10 and the matching device 62, and thus, the RF power source 10 calculates a frequency and the matching device 62 calculates only a capacitance value.

Calculation Circuit

The calculation circuit 16 receives detection signals (monitor signals) of a forward wave and a reflected wave detected by the detection circuit 14 and converted into digital signals by the A/D conversion circuit 15 and detects a level of each signal.

Figure 4:
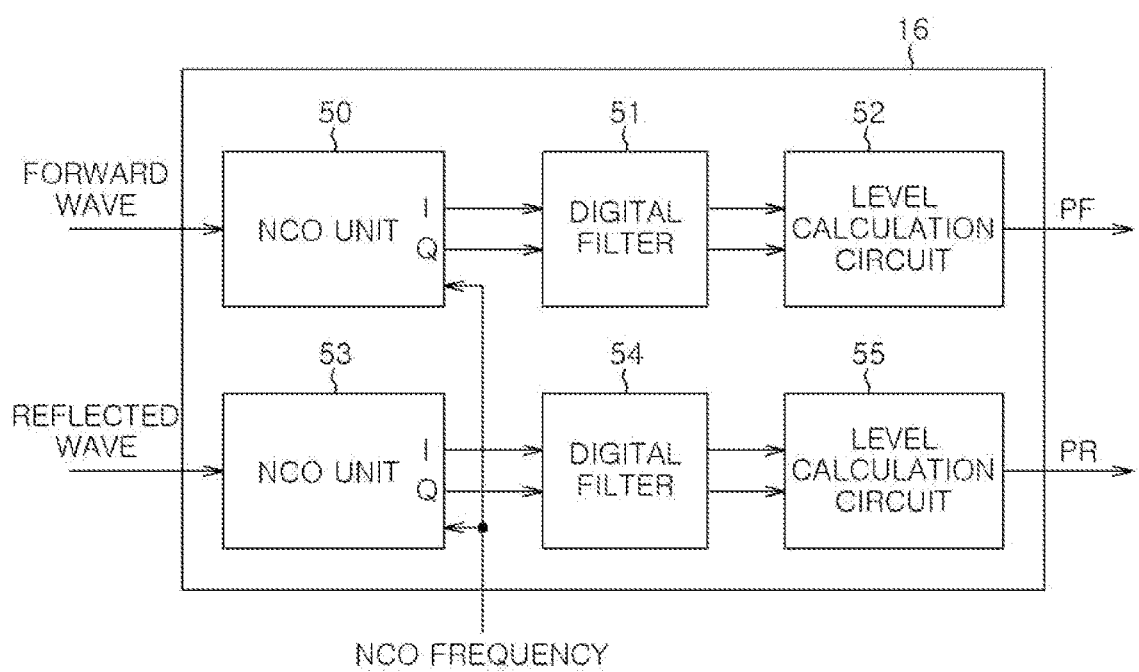
FIG. 4 is a schematic block diagram of a calculation circuit of FIG. 2.

A configuration of the calculation circuit 16 will be described with reference to FIG. 4. FIG. 4 is a schematic block diagram of the configuration of the calculation circuit 16.

As shown in FIG. 4, the calculation circuit 16 includes a numerical controlled oscillator (NCO) unit 50 configured to process a forward wave, a digital filter 51, a level calculation circuit 52, an NCO unit 53 configured to process a reflected wave, a digital filter 54, and a level calculation circuit 55.

The NCO unit 50 includes an NCO configured to generate a sine wave and a cosine wave and a multiplier, multiplies an input forward wave signal by each of the sine wave and the cosine wave, and outputs an in-phase component I and a quadrature component Q of the forward wave. Since an NCO frequency is set in conjunction with a frequency of a RF wave, a desired wave (input forward wave signal) becomes a baseband signal through a calculation with an output of the NCO. In the NCO unit 50, an NCO frequency corresponding to an output frequency of the RF power source 10 (oscillation frequency of the oscillation circuit 11) is set by a frequency management unit 19 to be described below. That is, in the RF Generator 610, the NCO frequency is changed in conjunction with a frequency set in the oscillation circuit 11.

The digital filter 51 is a band pass filter configured to pass a specific bandwidth around an output frequency of RF power and removes an interference wave or an intermodulation wave (hereinafter, referred to as an interference wave component) from an in-phase component and a quadrature component of a forward wave input at an operation sampling frequency.

Specifically, the digital filter 51 passes a band having a specific frequency width (for example, ±10 kHz) from a center frequency and attenuates other bands, thereby removing an interference wave component caused by the RF power source 20. That is, a pass band of the digital filter 51 is twice a specific bandwidth (here, 10 kHz).

Here, in the digital filter 51, a frequency set in the NCO of the NCO unit 50 is set to a set value corresponding to a frequency of the oscillation circuit 11, and thus, the set frequency becomes a center frequency of the pass band. As a result, even when the frequency of the oscillation circuit 11 fluctuates, the digital filter 51 passes only a band of ±10 kHz from a frequency of RF power and reliably removes the interference wave component separated from the band by more than 10 kHz.

The level calculation circuit 52 receives an in-phase component and a quadrature component of a forward wave from which the interference wave component is removed, and calculates a power level of the forward wave (referred to as a forward wave level or PF). As a result, an accurate forward wave level that does not include an influence of an interference wave is calculated and output to the matching calculation unit 17.

The NCO unit 53, the digital filter 54, and the level calculation circuit 55 perform the same processing on a reflected wave as in the NCO unit 50, the digital filter 51, and the level calculation circuit 52, respectively. Specifically, the NCO unit 53 includes an NCO and a multiplier, multiplies an input reflected wave by a sine wave and a cosine wave, and outputs an in-phase component and a quadrature component of the reflected wave. The digital filter 54 limits a band of the in-phase component and the quadrature component of the input reflected wave, passes only a specific band (here, ±10 kHz) using a frequency of RF power as a center frequency, and removes an interference wave component. The level calculation circuit 55 calculates an accurate power level of the reflected wave (referred to as reflected wave level or PR) which does not include an influence of an interference wave, and outputs the calculated power level to the matching calculation unit 17.

In addition, although not shown here, the calculation circuit 16 calculates and outputs the above-described reflection coefficient to the matching calculation unit 17.

Figure 5:
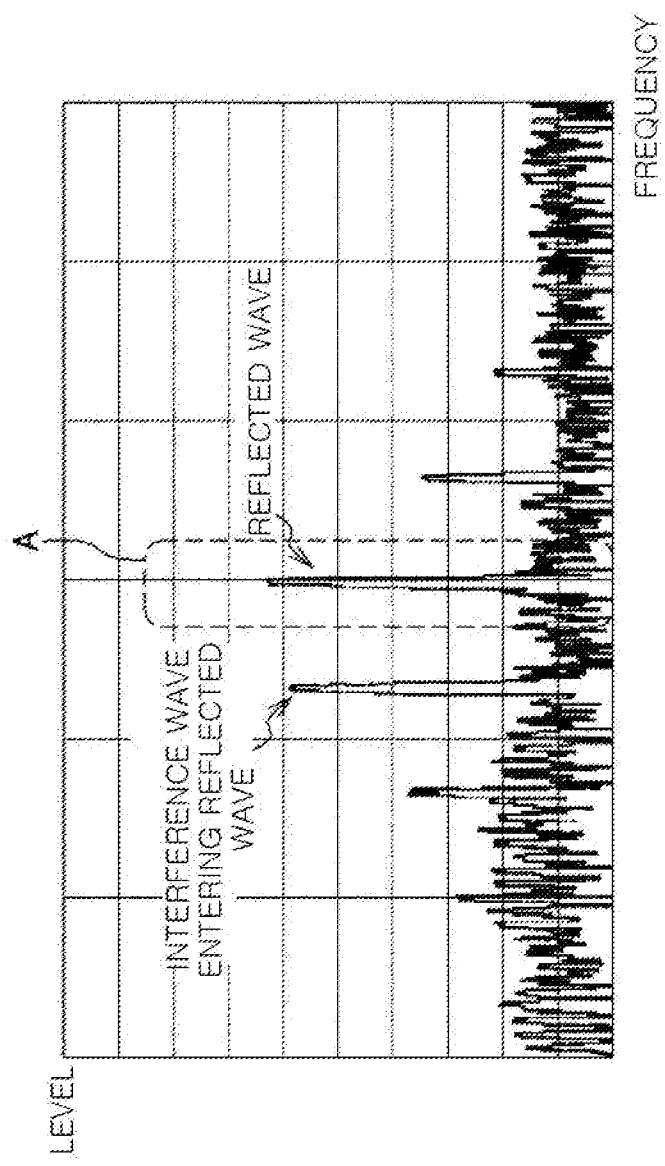
FIG. 5 is an explanatory diagram illustrating an example when an interference wave is observed in a reflected wave detection circuit.

Here, an example in which an interference wave is observed in a reflected wave detection circuit is shown in FIG. 5. FIG. 5 is an explanatory diagram illustrating the example when the interference wave is observed in the reflected wave detection circuit.

As shown in FIG. 5, a non-negligible level of an interference wave is observed with respect to a reflected wave at a central portion of a screen. The digital filter 54 passes a reflected wave in a pass band A and removes an interference wave in a band excluding the pass band A.

Matching Calculation Unit

Returning to FIG. 2, the matching calculation unit 17 performs a matching calculation process of calculating an oscillation frequency to be set in the oscillation circuit 11 and a capacitance value of the variable capacitor 83 of the matching device 62 based on a level of an input forward wave, a level of a reflected wave, and a reflection coefficient such that the level of the reflected wave is decreased, and outputting the calculated capacitance value to the matching device 62. In addition, the capacitance value is set in the capacitance setting circuit 82 of the matching device 62 from the matching calculation unit 17 through the control line 10b.

The matching calculation unit 17 of the RF power source 10, instead of immediately outputting to the frequency setting circuit 18 a value of the oscillation frequency calculated through the matching calculation process, performs a frequency interlocking process of comparing the value of the calculated oscillation frequency (candidate frequency) with an oscillation frequency of the RF power source 20 which is the other power source, checking whether an interference wave component is removable, and outputting an appropriate frequency value to the frequency setting circuit 18. Specifically, in the RF power source 10, a frequency of the oscillation circuit 11 is set to separate from the oscillation frequency of the RF power source 20 by a specific frequency (here, 10 kHz) or more such that an interference wave component caused by a RF power from the RF power source 20 may be reliably removed by the digital filters 51 and 54. Although the frequency interlocking process will be described below, due to the frequency interlocking process, in digital filters of calculation circuits 16 and 26 in the RF power source 10 and the RF power source 20, an interference wave component caused by the other power source separates from a center frequency by 10 kHz or more, thereby being sufficiently attenuated and reliably removed.

Frequency Management Unit

As shown in FIG. 2, the frequency management unit 19 maintains a value of an oscillation frequency (first oscillation frequency) input from the matching calculation unit 17 and set in the oscillation circuit 11, and sets an NCO frequency in the calculation circuit 16 according to the value of the oscillation frequency. In addition, the frequency management unit 19 receives a value of an oscillation frequency (second oscillation frequency) output from a frequency management unit 29 of the RF power source 20 and maintains the value of the oscillation frequency therein, and outputs the value of the second oscillation frequency to the matching calculation unit 17 in response to a request from the matching calculation unit 17.

RF Power Source

As shown in FIG. 2, the RF power source 20 has the same configuration as the RF power source 10. However, the RF power source 20 operates as the slave device in this embodiment, and, thus, the RF power source 20 does not perform a frequency interlocking process, and sets a calculated candidate frequency as an oscillation frequency without any change. In the RF power source 20, an oscillation circuit 21, an excitation amplifier circuit 22, a main amplifier circuit 23, a detection circuit 24, an A/D conversion circuit 25, the calculation circuit 26, and a frequency setting circuit 28 respectively have the same configurations and operations as circuits denoted by reference numerals having the same first digits as reference numerals denoting the above-described components of the RF power source 10 (xx circuit 2n=xx circuit 1n). In addition, as in the RF power source 10, a matching calculation unit 27 and the matching device 65 of the RF power source 20 are connected through the control line 20b.

The matching calculation unit 27 of the RF power source 20 which operates as the slave device uses a level of a forward wave, a level of a reflected wave, and a reflection coefficient input from the calculation circuit 26 and performs a matching calculation process of determining a frequency (second oscillation frequency) of the oscillation circuit 21 and determining a capacitance value of the variable capacitor of the matching device 65 such that the level of the reflected wave is decreased. The determined frequency is output to the frequency setting circuit 28 and the frequency management unit 29, and the capacitance value is output to the matching device 65 through the control line 20b.

The frequency management unit 29 maintains the value of the second oscillation frequency therein and outputs the value of the second oscillation frequency to the frequency management unit 19 of the RF power source 10. In addition, the frequency management unit 29 sets an NCO frequency in the calculation circuit 26 according to the value of the second oscillation frequency.

Operation of RF Generator

The operation of the RF Generator 610 will be described with reference to FIGS. 2 and 3. Basically, the first system 611 will be mainly described, and only the parts of the second system 622 different from those of the first system 611 will be described.

As shown in FIG. 2, in the RF power source 10, the oscillation circuit 11 oscillates the set first oscillation frequency to output RF power, and the RF power is amplified to a predetermined level by the excitation amplifier circuit and the main amplifier circuit 13 and output to the matching device 62 through the detection circuit 14 and the RF coaxial cable 10*a*. In the matching device 62, the RF power is impedance-matched and output to the plasma reactor 60 through the antenna 63.

The detection circuit 14 detects and inputs a forward wave and a reflected wave to the A/D conversion circuit 15 as monitor signals, and the forward wave and the reflected wave are converted into digital signals. The calculation circuit 16 quadrature-detects each of the forward wave and the reflected wave and extracts an in-phase component and a quadrature component. The digital filters 51 and 54 each limits a band of each of the in-phase component and the quadrature component to remove an interference wave component, and the level calculation circuits 52 and 55 calculate a level of the forward wave, a level of the reflected wave, and a reflection coefficient.

The matching calculation unit 17 uses a level of an input reflected wave and the like, calculates a value of a candidate frequency to be set in the oscillation circuit 11 and calculates a capacitance value to be set in the variable capacitor 83 of the matching device 62 such that so that the level of the reflected wave is decreased, and outputs the capacitance value to the capacitance setting circuit 82 of the matching device 62.

In addition, as a frequency interlocking process, the matching calculation unit 17 acquires an oscillation frequency (second oscillation frequency) of the RF power source 20 from the frequency management unit 19, compares the calculated candidate frequency with a second oscillation frequency, performs the frequency interlocking process such that the candidate frequency differs from the second oscillation frequency by a specific frequency difference or more, and determines the candidate frequency as an oscillation frequency of the oscillation circuit 11 (first oscillation frequency) when the candidate frequency differs from the second oscillation frequency by the specific frequency difference or more. The first oscillation frequency is set in the oscillation circuit 11 through the frequency setting circuit 18.

In addition, in the RF power source 20, the matching calculation unit 27 calculates a capacitance value and a second oscillation frequency, the capacitance value is set in the matching device 65, and the second oscillation frequency is set in the oscillation circuit 21 through the frequency setting circuit 28. In addition, the second oscillation frequency is output to the frequency management unit 29, is maintained by the frequency management unit 29, is output to the frequency management unit 19 of the RF power source 10, and is used for a frequency interlocking process in the matching calculation unit 17.

In this way, the operation of the RF Generator 610 is performed.

Processes in Matching Calculation Unit

Figure 6:
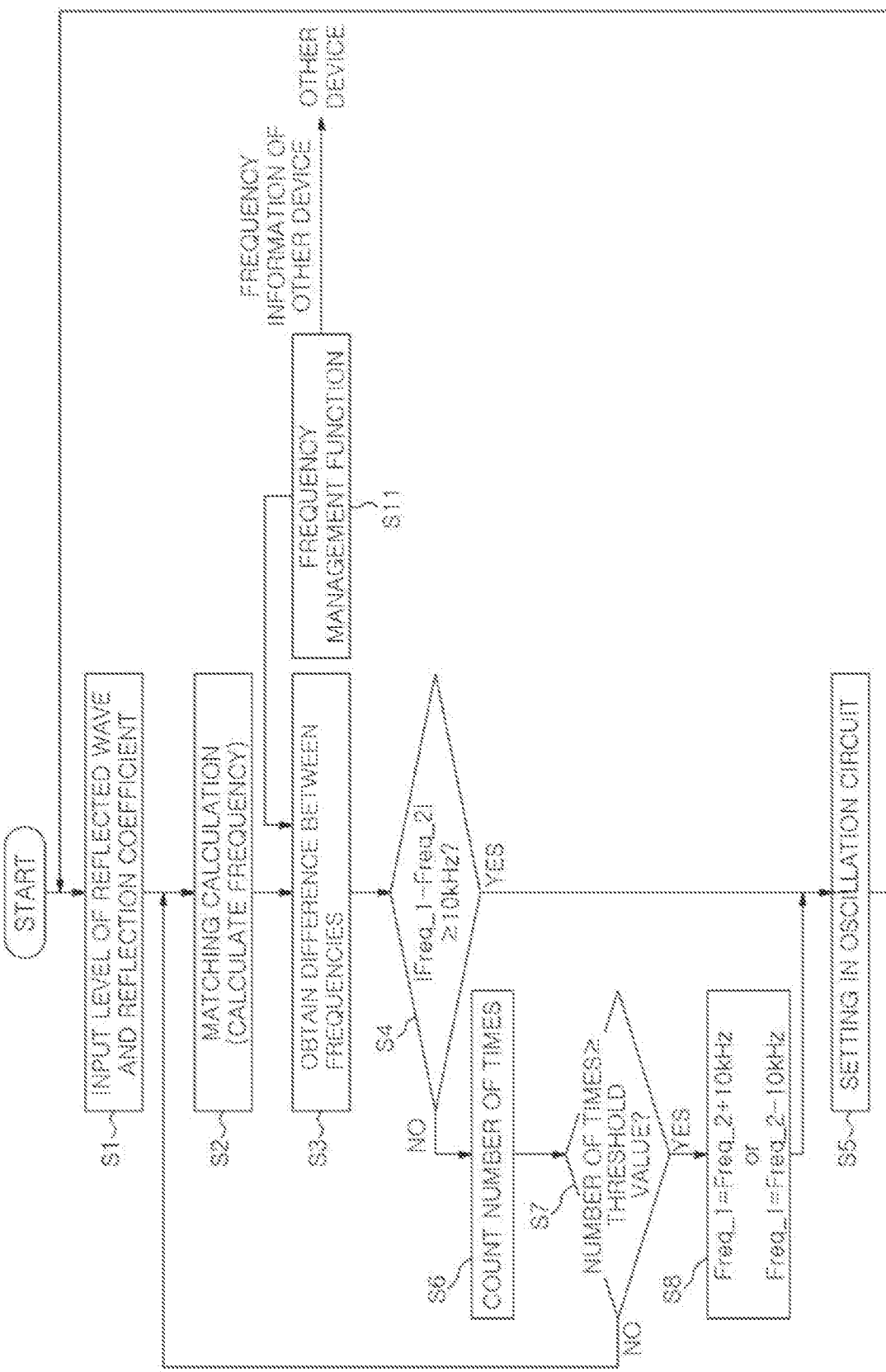
FIG. 6 is a flowchart illustrating processes in a matching calculation unit 17 of FIG. 2.

Next, processes in the matching calculation unit 17 will be described with reference to FIG. 6. FIG. 6 is a flowchart illustrating the processes in the matching calculation unit 17 of the RF power source 10.

As shown in FIG. 6, when a level of a reflected wave and a reflection coefficient are input (process S1), the matching calculation unit 17 performs a matching calculation based on the level of the reflected wave and the reflection coefficient and calculates a candidate frequency (Freq_1) to be set in the oscillation circuit 11 such that the level of the reflected wave is decreased (process S2). Meanwhile, in process S2, a capacitance value of the variable capacitor 83 of the matching device 62 is also calculated and output to the matching device 62, but illustration thereof is omitted here.

In addition, through a frequency management function, the frequency management unit 19 acquires an oscillation frequency (second oscillation frequency, Freq_2) of the RF power source 20 from the frequency management unit 29 of the other RF power source 20, and maintains the acquired oscillation frequency (second oscillation frequency, Freq_2) (process S11). The matching calculation unit 17 acquires the second oscillation frequency (Freq_2) from the frequency management unit 19 and obtains a difference (|Freq_1−Freq_2|) between the candidate frequency (Freq_1) calculated in process S2 and the acquired second oscillation frequency (Freq_2) (process S3).

The matching calculation unit 17 determines whether the difference |Freq_1−Freq_2| calculated in process S3 is 10 kHz or more (process S4). Here, since the digital filters of the calculation circuits 16 and 26 have a characteristic of passing a frequency in a range of ±10 kHz around a center frequency (oscillation frequency), the matching calculation unit 17 checks whether the difference between the candidate frequency and the second oscillation frequency is 10 kHz or more.

In process S4, when the difference between the frequencies is 10 kHz or more (in the case of Yes), the matching calculation unit 17 determines the candidate frequency calculated in process S4 as a first oscillation frequency, outputs the first oscillation frequency to the frequency setting circuit 18, sets the first oscillation frequency in the oscillation circuit 11, and outputs the first oscillation frequency to the frequency management unit 19 (process S5). Then, the process flow returns to process S1, and the processes are repeated.

Furthermore, in process S4, when the difference between the frequencies is less than 10 kHz (in the case of No), the matching calculation unit 17 counts (increments) the number of times of calculations of the difference between the frequencies (the number of repetitions) (process S6) and determines whether the number of times is greater than or equal to a preset threshold value (process S7).

In process S7, when the number of repetitions does not reach the threshold value (in the case of No), the process flow returns to process S2. Then, the matching calculation unit 17 receives a level of a reflected wave and a reflection coefficient from the calculation circuit 16, and performs a matching calculation again to calculate a candidate frequency.

When the difference between frequencies is less than 10 kHz and the candidate frequency (Freq_1) is set in the oscillation circuit 11 without any adjustment, an interference wave component will be generated within a pass band of the digital filter. Since an interference wave cannot be removed, the current candidate frequency (Freq_1) will not be an appropriate value. Therefore, the matching calculation unit 17 should newly acquire a level of a reflected wave and the like and repeat a calculation.

In addition, in process S7, when the number of times reaches the threshold value (in the case of Yes), the matching calculation unit 17 determines the candidate frequency (Freq_1), which is a frequency (Freq_1=Freq_2+10 kHz) obtained by adding 10 kHz to the second oscillation frequency or is a frequency (Freq_1=Freq_2−10 kHz) obtained by subtracting 10 kHz from the second oscillation frequency, as a first oscillation frequency (process S8) and proceeds to process S5 to set the first oscillation frequency in the oscillation circuit 11 through the frequency setting circuit (process S5).

That is, even though a matching calculation is repeated a predetermined number of times, when the candidate frequency does not deviate from the second oscillation frequency by 10 kHz or more, the matching calculation unit 17 forcibly determines the first oscillation frequency as a frequency deviating from the second oscillation frequency by 10 kHz or more to expedite the process.

In process S8, it may be determined in advance whether to select, as the first oscillation frequency, a frequency on a RF side or a low frequency side with respect to the second oscillation frequency (Freq_2), and the first oscillation frequency may be appropriately determined according to a value of the second oscillation frequency.

Processes S3 to S8 are a frequency interlocking process. In this way, the processes in the matching calculation unit 17 are performed.

As a result, in the RF Generator of the present embodiment, each of the plurality of RF power sources can reliably attenuate an interference wave component due to an influence of a RF wave from the other power source using the digital filter of the calculation circuit, can detect a forward wave and a reflected wave which do not include the interference wave component, can calculate a level of the forward wave and a level of the reflected wave with high accuracy, and can perform a more stable matching operation to improve power efficiency.

In addition, here, it has been described that the RF power source 10 which is the master device performs a frequency interlocking process, and the RF power source 20 which is the slave device only notifies the master device of an oscillation frequency set by itself, but the operation may be carried out in an opposite manner. That is, a configuration is also possible in which the master device notifies the slave device of an oscillation frequency set by itself, and the slave device performs a frequency interlocking process based on information thereof and sets an oscillation frequency thereof such that a difference between oscillation frequencies is 10 kHz or more.

Furthermore, the host device 68 may acquire candidate frequencies from the frequency management units 19 and 29 of the two RF power sources 10 and 20 and may perform control such that a difference between two candidate frequencies is 10 kHz or more. In this case, only the oscillation frequency of one RF power source may be adjusted, or the oscillation frequency of both the RF power sources may be adjusted. In this case, the frequency management units 19 and 29 transmit the candidate frequencies to the host device 68 and set oscillation frequencies designated by the host device 68 in the oscillation circuits 11 and 21 through the matching calculation units 17 and 27 and the frequency setting circuits 18 and 28.

Whether an operation is controlled by the master device, by the slave device, or by the host device 68 is set in advance as an operation mode, and each device is designed to perform processes according to the set operation mode.

Another Configuration of the Digital Filter

In the above-described example, although the digital filters 51 and 54 of the calculation circuit 16 have been described as band pass filters, the digital filters 51 and 54 may be formed as low pass filters which pass a band less than or equal to a specific frequency. In this case, a cutoff frequency of the low pass filter is set to a frequency higher than an output frequency of the RF power source 10 by a specific bandwidth (for example, 10 kHz). As a result, a frequency lower than the output frequency of the RF power source 10 plus 10 kHz is passed and an interference wave component greater than or equal to the output frequency of the RF power source 10 plus 10 kHz is removed.

The operation of the matching calculation unit 17 when the low pass filter is used will be briefly described.

As in the case of using the band pass filter, the matching calculation unit 17 calculates a candidate frequency as a candidate for an oscillation frequency such that a level of a reflected wave is decreased. Based on the candidate frequency, an oscillation frequency is determined such that an oscillation frequency of the RF power source 10 is lower than an oscillation frequency of the other RF power source 20 by a specific frequency (for example, 10 kHz) or more.

In the case of the band pass filter, the oscillation frequency of the RF power source 10 may be higher or lower than the oscillation frequency of the other RF power source 20 by a specific frequency or more, but in the case of the low pass filter, it is determined to be lower than the oscillation frequency of the other RF power source 20. That is, a cutoff frequency of the low pass filter becomes the oscillation frequency of the RF power source 10 plus 10 kHz. As a result, an interference wave component caused by the RF power source 20 becomes higher than the cutoff frequency of the low pass filter and thus is attenuated by the digital filters 51 and 54, thereby accurately calculating a level of a forward wave and a level of a reflected wave.

As in the case of the band pass filter, the matching calculation unit 17 may set an NCO frequency according to an oscillation frequency, and thus, even though the oscillation frequency fluctuates, a cutoff frequency can always be set to an oscillation frequency plus a specific frequency, and an interference wave component can be reliably removed.

Furthermore, as in the case of the band pass filter, when a frequency deviating from an oscillation frequency of the other RF Generator by a specific frequency or more is not obtained as a candidate frequency even though a matching calculation is performed a predetermined number of times, the frequency deviating from the oscillation frequency of the other RF Generator by a specific frequency or more (here, 10 kHz or more) is forcibly set in the oscillation circuit.

Effects of First Embodiment

The RF Generator of the first embodiment includes the plurality of RF power sources 10 and 20 and the matching devices 62 and 65, and one RF power source 10 includes, in the calculation circuit 16, the digital filter 51 having a pass band including a center frequency that is a frequency of a forward wave and a reflected wave and a specific frequency width. The frequency management unit 19 stores an oscillation frequency of the other RF power source 20, and the matching calculation unit 17 is configured to calculate a candidate frequency as a candidate for an oscillation frequency such that a level of a reflected wave is decreased and to determine the oscillation frequency based on the candidate frequency such that a frequency difference between the oscillation frequency of the other RF power source 20 and the oscillation frequency of the RF power source 10 is greater than or equal to a specific frequency. As a result, the frequencies of the plurality of RF power sources 10 and 20 can be controlled so as to be separate from each other by a specific frequency difference or more, and interference wave components included in detection signals of reflected waves can be reliably removed by the digital filters 51 and 54, thereby calculating an accurate level of the reflected wave and realizing highly accurate matching to improve power efficiency.

In addition, the RF Generator of the first embodiment has a configuration in which the matching calculation unit 17 sets information about an NCO frequency according to an oscillation frequency in the calculation circuit 16. As a result, a center frequency of the digital filter 51 can match the oscillation frequency, and even though the oscillation frequency fluctuates, the digital filter 51 can reliably remove an interference wave component.

Furthermore, the RF Generator of the first embodiment is configured to arbitrarily select whether a frequency interlocking process of controlling frequencies in the plurality of RF power sources in conjunction with each other is performed by any one of the master device, the slave device, and the host device. As a result, a degree of freedom in system design can be considerably increased.

In addition, the plasma processing apparatus of the first embodiment is configured to receive power from the above-described RF Generator. As a result, impedance matching of RF power can be performed with high accuracy, plasma can be stably generated, and distribution characteristics can be improved, thereby performing satisfactory plasma processing.

As described above, the RF Generator of the first embodiment performs a stable matching operation and an output control operation by removing components excluding its own oscillation frequency, but changes in state in the plasma reactor (such as sudden changes or changes over time in level of an interference wave) are not detected and monitored.

Second Embodiment

Therefore, in a second embodiment, changes in state in a plasma reactor (such as sudden changes or changes over time in level of an interference wave) are detected and monitored, the yield of a plasma processing apparatus is improved(quality is increased), and opportunity loss is reduced through a timely action in apparatus maintenance.

Configuration of Plasma Processing Apparatus

Figure 7:
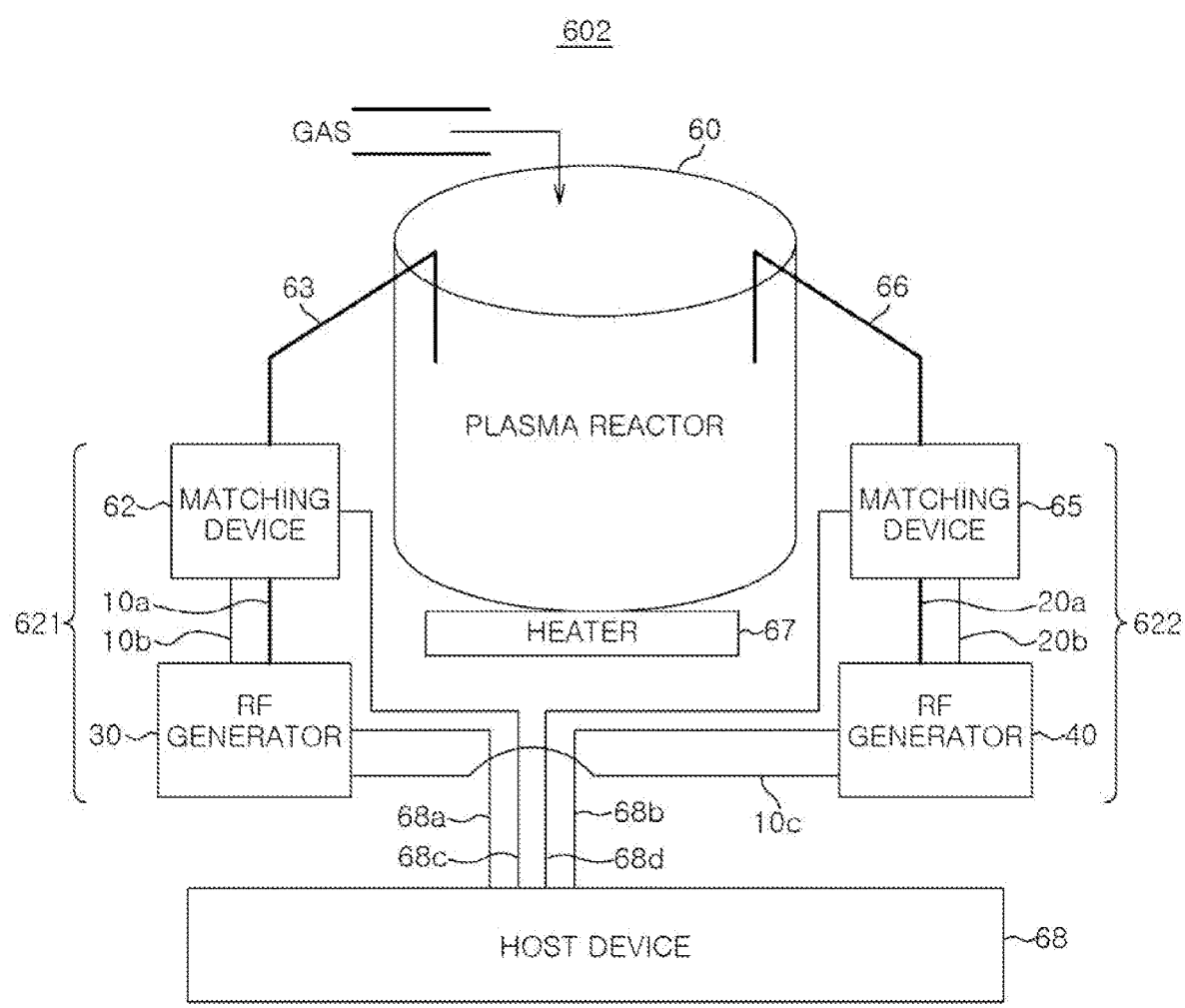
FIG. 7 is a schematic diagram illustrating a configuration of a plasma processing apparatus according to a second embodiment.

A configuration of the plasma processing apparatus of the second embodiment will be described with reference to FIG. 7. FIG. 7 is a schematic diagram illustrating the configuration of the plasma processing apparatus of the second embodiment. In addition, the same reference numerals are given to the same parts as those of the plasma processing apparatus of the first embodiment described above.

As shown in FIG. 7, a plasma processing apparatus 602 of the second embodiment includes a plasma reactor 60, a heater 67, antennas 63 and 66, RF power sources 30 and 40, matching devices 62 and 65, and a host device 68 which performs control related to the plasma processing apparatus. The plasma processing apparatus 602 of the second embodiment has the same configuration and connections as the plasma processing apparatus 601 of the first embodiment excluding the RF power sources, and descriptions other than those of the RF power sources will be omitted.

Configuration of RF Generator

Figure 8:
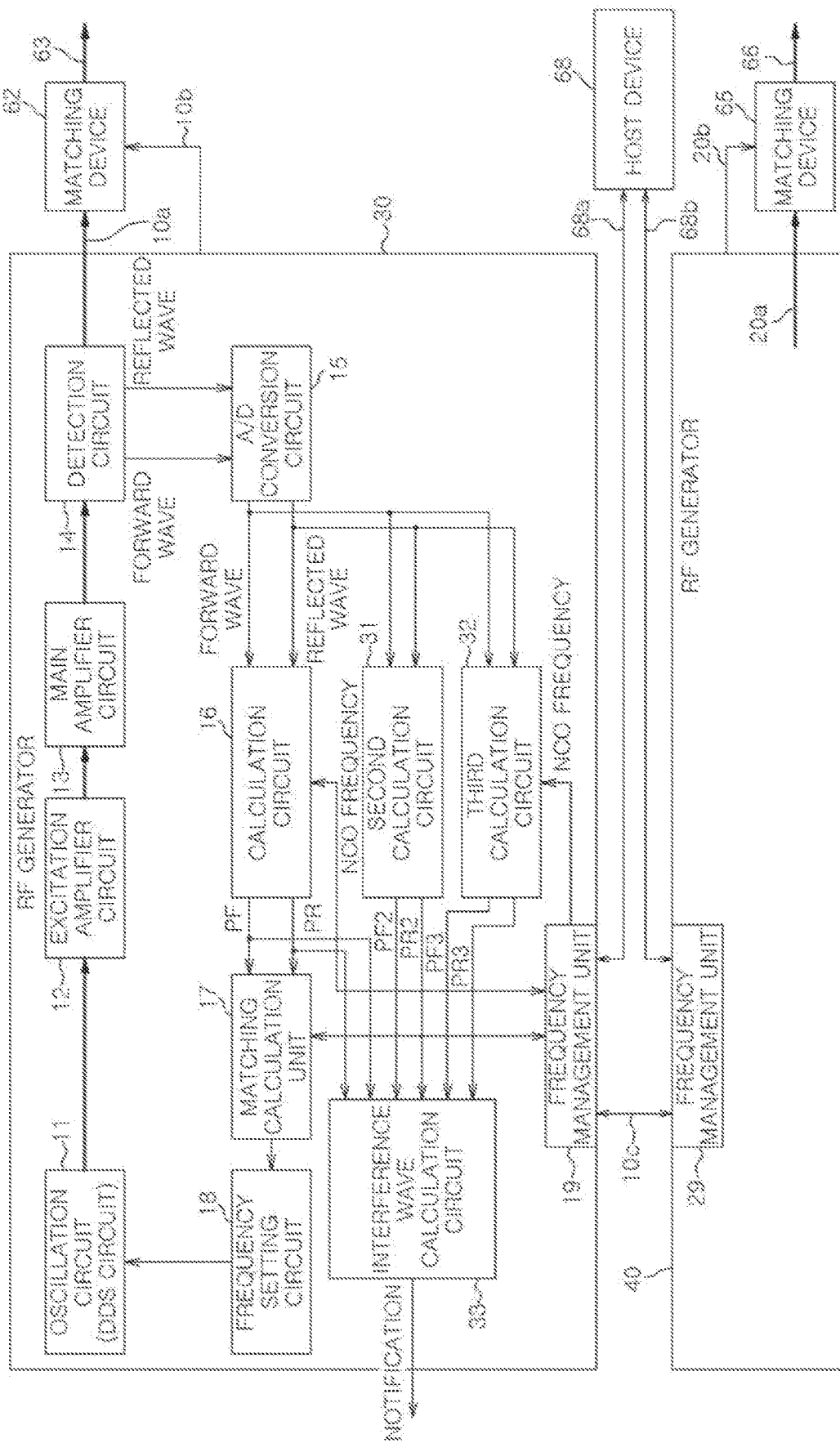
FIG. 8 is a block diagram illustrating a configuration of a RF Generator of FIG. 7.

A configuration of a RF Generator of the second embodiment will be described with reference to FIG. 8. FIG. 8 is a block diagram illustrating the configuration of the RF Generator of the second embodiment. Here, although the RF power source 30 and the matching device 62 of a first system 621 will be described, the RF power source 40 and the matching device 65 of a second system 622 also have the same configurations and operations.

As shown in FIG. 8, although the RF power source 30 and the RF power source 40 have the same basic configurations as the RF power source 10 and the RF power source 20 in the configurations of the RF generator of the first embodiment, in addition to a calculation circuit (first calculation circuit) 16, the RF power source 30 and the RF power source 40 each includes a second calculation circuit 31 and a third calculation circuit 32 to which an output of an A/D conversion circuit 15 is branched and input as a forward wave and a reflected wave, and an interference wave calculation circuit 33. In addition, the RF power sources 30 and 40 do not need to include the third calculation circuit 32, and even when including the third calculation circuit 32, do not need to use a function of the third calculation circuit 32. Furthermore, the RF power source 40 does not need to include the second calculation circuit 31, the third calculation circuit 32, and the interference wave calculation circuit 33, and even when including the second calculation circuit 31, the third calculation circuit 32, and the interference wave calculation circuit 33, does not need to use functions thereof even when including the second calculation circuit 31, the third calculation circuit 32, and the interference wave calculation circuit 33.

As in the first embodiment, the calculation circuit 16 includes a digital filter which has an oscillation frequency of the RF power source 30, which is a host device, as a pass band, and blocking an oscillation frequency of the RF power source 40 and an interference wave generated in the plasma reactor 60. In addition, the calculation circuit 16 detects a level of a forward wave (PF) and a level of a reflected wave level (PR) of the RF power source 30.

The second calculation circuit 31 detects a level of a forward wave (PF2) and a level of a reflected wave (PR2) including both of the oscillation frequencies of the RF power source 30 and the RF power source 40 and the interference wave generated in the plasma reactor 60. The second calculation circuit 31 includes a digital filter having a sufficiently wide pass band. In addition, the second calculation circuit may pass a forward wave, a reflected wave, and an interference wave without including the digital filter.

The third calculation circuit 32 includes a digital filter which has the oscillation frequency of the RF power source 40 as a pass band and blocks the oscillation frequency of the RF power source 30 and the interference wave generated in the plasma reactor 60. In addition, the third calculation circuit 32 detects a level of a forward wave (PF3) and a level of a reflected wave (PR3) input from the RF power source 40 through the plasma reactor 60.

The interference wave calculation circuit 33 calculates a level of an interference wave. PF2 and PR2 calculated by the second calculation circuit 31 include components of the oscillation frequency of the RF power source 30 and the oscillation frequency of the RF power source 40, and an interference wave component generated in the plasma reactor 60. Therefore, when a level of the oscillation frequency of the RF power source 30 of the calculation circuit 16 is subtracted from calculation results of the second calculation circuit 31, the subtraction result becomes a level of a frequency component excluding the oscillation frequency of the RF power source 30.

Further, when the level of the oscillation frequency of the RF power source 30 of the calculation circuit 16 and a level of the oscillation frequency of the RF power source 40 of the third calculation circuit 32 are subtracted from the calculation results of the second calculation circuit 31, the subtraction result becomes a level of an interference wave component generated in the plasma reactor 60.

By notifying a user of a level of an interference wave calculated by the interference wave calculation circuit 33, the user can obtain a new state monitoring item of the plasma reactor 60, monitor changes in state in the plasma reactor 60 (such as sudden changes and changes over time in the level of the interference wave), and perform timely maintenance. In addition, when there is a relationship between a level of an interference wave and quality of the plasma reactor 60, it is possible to contribute to improving yield and quality.

Configuration of Calculation Circuit

Figure 9:
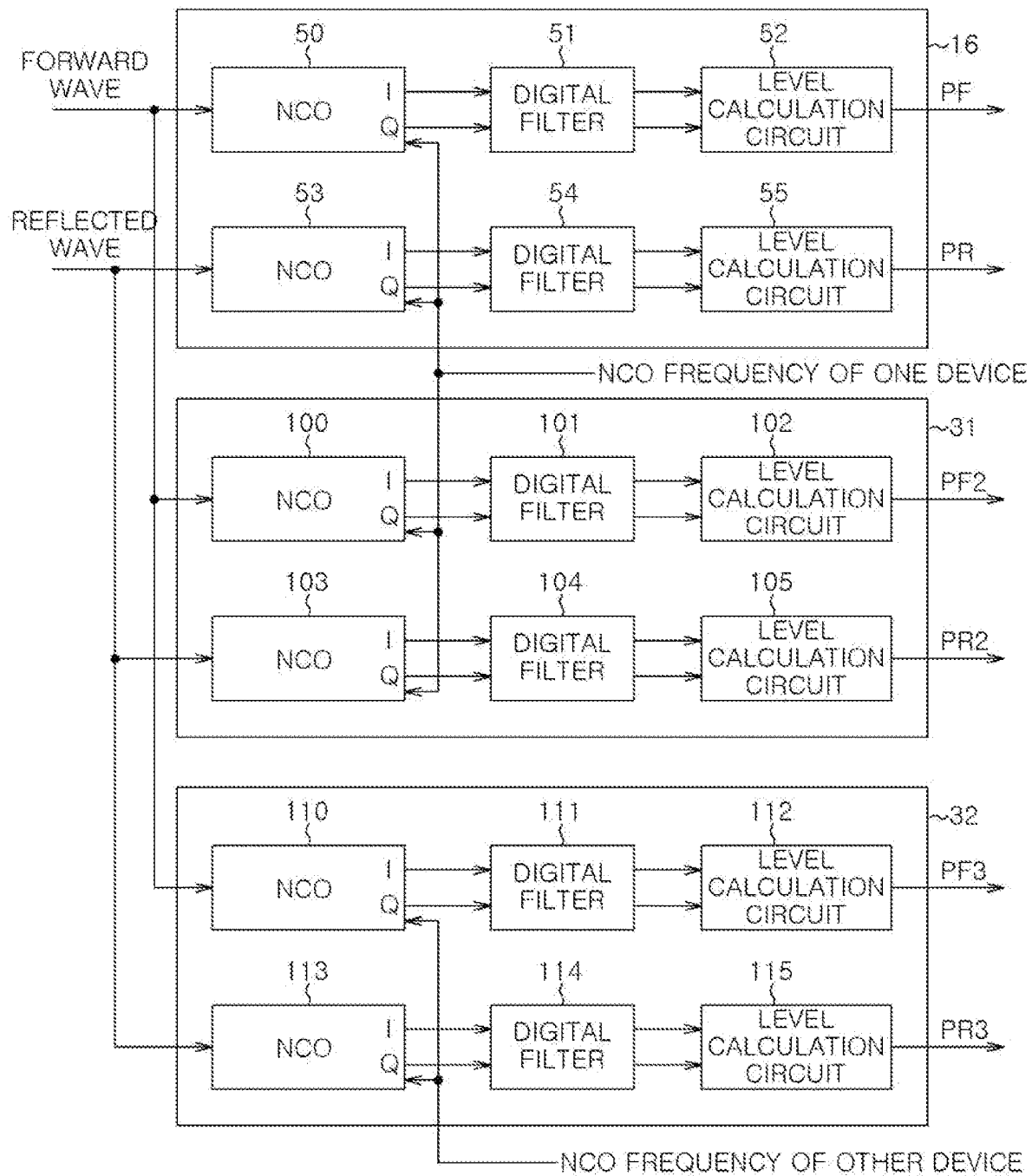
FIG. 9 is a schematic diagram illustrating configurations of a calculation circuit, a second calculation circuit, and a third calculation circuit of FIG. 8.

Configurations of the calculation circuit 16, the second calculation circuit 31, and the third calculation circuit 32 will be described with reference to FIG. 9. FIG. 9 is a schematic diagram illustrating the configurations of the calculation circuit, the second calculation circuit, and the third calculation circuit of FIG. 8.

As shown in FIG. 9, as in the first embodiment, the calculation circuit 16 includes an NCO unit 50 configured to process a forward wave, a digital filter 51, a level calculation circuit 52, an NCO unit 53 configured to process a reflected wave, a digital filter 54, and a level calculation circuit 55.

The second calculation circuit 31 has the same circuit configuration as the calculation circuit 16, but digital filters thereof are different from those of the calculation circuit 16. By allowing to pass through digital filters 101 and 104 or allowing the digital filters 101 and 104 to have a sufficiently wide pass band, the second calculation circuit 31 may calculate levels including an oscillation frequency of the RF power source 30, an oscillation frequency of the RF power source 40, and an interference wave component generated in the plasma reactor 60.

The third calculation circuit 32 has the same configuration as the calculation circuit 16, but an NCO frequency supplied to an NCO unit is different from that of the calculation circuit 16. The third calculation circuit 32 operates the NCO unit at an oscillation frequency of the RF power source 40 and calculates a level of an oscillation frequency component of the RF power source 40 with respect to a signal thereof using digital filters 111 and 114.

Figure 10:
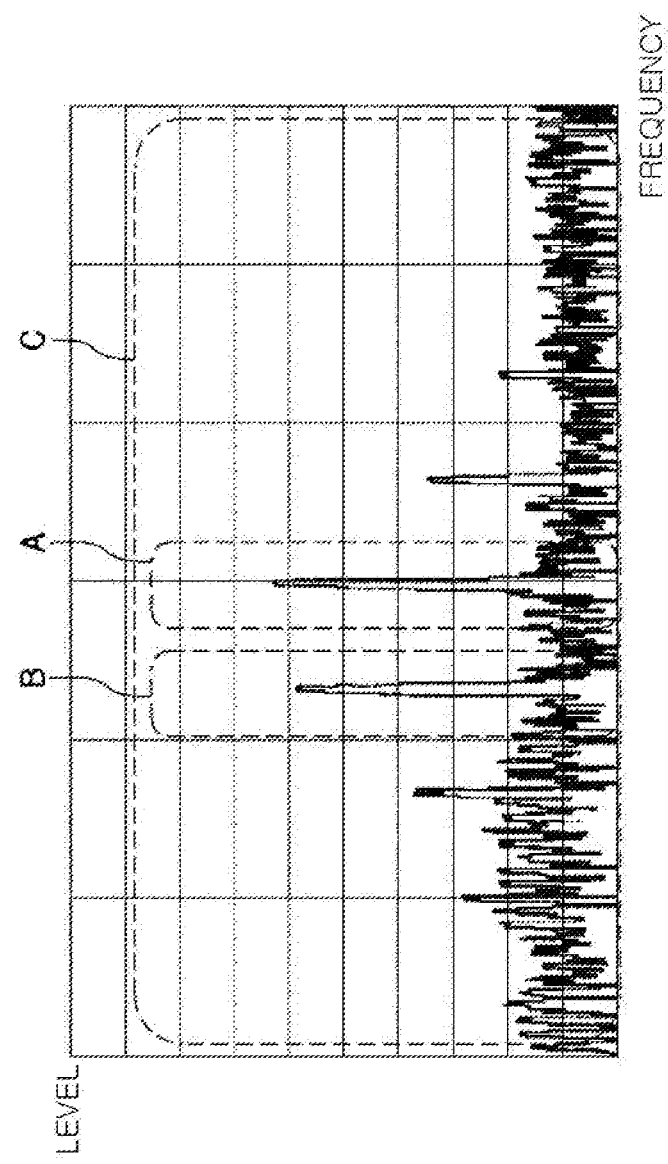
FIG. 10 is an explanatory diagram showing an example of waveforms detected by the calculation circuit, the second calculation circuit, and the third calculation circuit of FIG. 8.

Here, signals handled by the interference wave calculation circuit 33 will be described with reference to FIG. 10. FIG. 10 is an explanatory diagram showing an example of waveforms detected by the calculation circuit, the second calculation circuit, and the third calculation circuit of FIG. 8 and is a diagram showing an example when an interference wave is observed in the reflected wave detection circuit.

As shown in FIG. 10, signals handled by the interference wave calculation circuit 33 are, for example, a level of an oscillation frequency of the RF power source 30 passing through a pass band A of the digital filter 54 of the calculation circuit 16, a level of an oscillation frequency of the RF power source 40 passing through a pass band B of the digital filter 114 of the third calculation circuit 32, and an overall level passing through a pass band C of the digital filter 104 of the second calculation circuit 31.

The interference wave calculation circuit 33 subtracts the level of the RF power source 30 from the overall level passing through the pass band C of the digital filter 104 of the second calculation circuit 31, thereby calculating a level of an interference wave excluding the RF power source 30, that is, a level of an interference wave entering the RF power source 30 (including a level of an interference wave generated in the plasma reactor 60 and an oscillation level of the other RF power source 40 arriving through the plasma reactor 60). In addition, the interference wave calculation circuit 33 subtracts the level of the RF power source 30 and the level of the RF power source 40 from the overall level passing through the pass band C of the digital filter 104 of the second calculation circuit 31, thereby detecting a level of an interference wave excluding the RF power source 30 and the RF power source 40, that is, a level of an interference wave entering the RF power source 30 (a level of an interference wave generated in the plasma reactor 60).

Effects of Second Embodiment

The RF Generator of the second embodiment includes the calculation circuit 16 which detects a forward wave and a reflected wave of an oscillation frequency of the RF Generator and removes an oscillation frequency component and an interference wave component of the other RF power source, the second calculation circuit 31 which detects levels including the oscillation frequency of the RF Generator and the oscillation frequency component and the interference wave component of the other RF power source, and the interference wave calculation circuit 33 which calculates a difference between the levels. As a result, it possible to detect a level of an interference wave entering the RF Generator (including a level of an interference wave generated by the plasma processing apparatus and an oscillation level of the other RF power source arriving through the plasma processing apparatus).

In addition, the RF Generator of the second embodiment includes the calculation circuit 16 which detects a forward wave and a reflected wave of an oscillation frequency of the RF Generator and removes an oscillation frequency component and an interference wave component of the other RF power source, the third calculation circuit 32 which detects levels of a forward wave and a reflected wave of an oscillation frequency of the other RF power source arriving through the plasma processing apparatus and removes an oscillation frequency component and an interference wave component of the RF Generator, the second calculation circuit 31 which detects levels including the oscillation frequency of the RF Generator and the oscillation frequency component and the interference wave component of the other RF power source, and the interference wave calculation circuit 33 which calculates a difference between the levels. As a result, it possible to detect a level of an interference wave entering the RF Generator (a level of an interference wave generated by the plasma processing apparatus).

In addition, in the RF Generator of the second embodiment, since a plurality of antennas are connected to the matching device, it is possible to adjust distribution characteristics of plasma. A level of an interference wave of each RF power source is monitored by monitoring a level of an interference wave, and thus, it is also effective when an antenna installation location is determined such that the antenna is disposed to make it difficult to cause interference.

Furthermore, since the plasma processing apparatus of the second embodiment uses the above-described RF Generator, it is possible to notify a user of a magnitude of a level of an interference wave generated in the plasma reactor and changes over time thereof, and it is possible to contribute to improving yield and quality of plasma processing and reducing opportunity loss through timely maintenance.

Although the present disclosure has been described in detail above on the basis of the embodiments thereof, the present disclosure is not limited to the embodiments. It will be easily appreciated that various other changes can be made.

EXPLANATION OF REFERENCE NUMERALS

30: RF power source (first RF power source)
16: calculation circuit (first calculation circuit)
31: second calculation circuit
33: interference wave calculation circuit
40: RF power source (second RF power source)

What is claimed is:

1. A RF Generator comprising a first RF power source and a second RF power source which generate RF waves having different frequencies and respectively supply RF powers to a first antenna and a second antenna installed in a plasma reactor,
    wherein the first RF power source includes:
        a first calculation circuit configured to remove an oscillation frequency component and an interference wave component of the second RF power source and detect a first forward wave level and a first reflected wave level;
        a second calculation circuit configured to detect a second forward wave level and a second reflected wave level containing an oscillation frequency of the first RF power source and the oscillation frequency component and the interference wave component of the second RF power source; and
        an interference wave calculation circuit configured to calculate an interference wave level detected by the first RF power source based on the second forward wave level, the second reflected wave level, the first forward wave level, and the first reflected wave level.

2. The RF Generator of claim 1, wherein the interference wave level calculated by the interference wave calculation circuit is an interference wave level generated in the plasma reactor and an oscillation level of the second RF power source arriving through the plasma reactor.

3. The RF Generator of claim 1, further comprising a third calculation circuit including a digital filter configured to detect a third forward wave level and a third reflected wave level of an oscillation frequency of the second RF power source arriving through the plasma reactor and configured to remove an oscillation frequency component and an interference wave component of the first RF power source,
    wherein the interference wave calculation circuit calculates the interference wave level detected by the first RF power source based on the second forward wave level and the second reflected wave level detected by the second calculation circuit, the first forward wave level and the first reflected wave level detected by the first calculation circuit, and the third forward wave level and the third reflected wave level detected by the third calculation circuit.

4. The RF Generator of claim 3, wherein the interference wave level calculated by the interference wave calculation circuit is an interference wave level generated in the plasma reactor.

5. The RF Generator of claim 1, further comprising:
    a first matching device connected to the first antenna and configured to match an output of the first RF power source; and
    a second matching device connected to the second antenna and configured to match an output of the second RF power source,
    wherein the first RF power source further includes a first oscillation circuit configured to oscillate a RF wave having a set oscillation frequency and a first matching calculation unit,
    the first calculation circuit calculates a reflection coefficient from the detected first forward wave level and the detected first reflected wave level, and
    based on the reflection coefficient, the first matching calculation unit calculates a control value in the first matching unit and calculates a candidate value of the oscillation frequency of the first oscillation circuit such that the first reflected wave level is decreased.

6. The RF Generator of claim 5, wherein the first RF power source further includes a first frequency management unit configured to maintain an oscillation frequency set in the first oscillation circuit by the first matching calculation unit and configured to receive and maintain an oscillation frequency from the second RF power source.

7. The RF Generator of claim 5, wherein, based on the candidate value of the oscillation frequency, the first matching calculation unit determines an oscillation frequency as a value that secures a specific frequency difference from an oscillation frequency of the second RF power source, and sets the oscillation frequency in the first oscillation circuit.

8. The RF Generator of claim 7, wherein, when the specific frequency difference from the oscillation frequency of the second RF power source is not securable, the first matching calculation unit repeats a calculation of the oscillation frequency, and when the calculation is performed a specific number of times, the first matching calculation unit determines the oscillation frequency as an oscillation frequency that secures the specific frequency difference, and sets the determined oscillation frequency in the first oscillation circuit.

9. The RF Generator of claim 7, further comprising a host device connected to the first RF power source and the second RF power source,
    wherein, based on the candidate value of the oscillation frequency, the host device determines an oscillation frequency as the value that secures the specific frequency difference from the oscillation frequency of the second RF power source, and sets the oscillation frequency in the first oscillation circuit.

10. The RF Generator of claim 9, wherein, when the specific frequency difference from the oscillation frequency of the second RF power source is not securable, the host device allows the first matching calculation unit to repeat a calculation of the oscillation frequency, and when the calculation is performed a specific number of times, the host device determines the oscillation frequency as an oscillation frequency that secures the specific frequency difference, and sets the determined oscillation frequency in the first oscillation circuit.

11. The RF Generator of claim 5, wherein a plurality of antennas are connected to the first matching device and the second matching device.

* * * * *